United States Patent [19]

Hansen et al.

[11] Patent Number: 4,562,405
[45] Date of Patent: Dec. 31, 1985

[54] MULTIPLEXED BUFFER

[75] Inventors: Kenneth A. Hansen, Bedford; Gary A. Kurtzman, Euless, both of Tex.

[73] Assignee: Motorola, Inc., Schaumburg, Ill.

[21] Appl. No.: 625,347

[22] Filed: Jun. 27, 1984

[51] Int. Cl.⁴ .............................................. H03F 3/00
[52] U.S. Cl. ........................................ 330/51; 330/86; 330/148; 330/282
[58] Field of Search .................... 330/51, 86, 151, 148, 330/282; 307/244; 328/152, 153

[56] References Cited

U.S. PATENT DOCUMENTS

| | | | |
|---|---|---|---|
| 3,399,358 | 8/1968 | Rinehart | 330/149 |
| 3,525,948 | 8/1970 | Sherer et al. | 330/51 |
| 3,696,305 | 10/1972 | Mitchell et al. | 330/51 |
| 3,737,798 | 6/1973 | Faraguet et al. | 330/85 |
| 4,066,919 | 1/1978 | Huntington | 307/353 |
| 4,085,380 | 4/1978 | Williford | 330/107 |
| 4,138,649 | 2/1979 | Schaffer | 330/9 |
| 4,152,659 | 5/1979 | Gordon | 330/9 |
| 4,337,440 | 6/1982 | de Korte | 330/129 |

Primary Examiner—James B. Mullins
Attorney, Agent, or Firm—Thomas G. Berry; Donald B. Southard

[57] ABSTRACT

A buffer is described which includes two gain stages which may be constructed of MOS devices, the first stage having a low noise characteristic and the second stage having a high current drive capability. The second stage is switched in circuit only when high current drive is needed so that the buffer otherwise exhibits the low noise characteristics of the first stage. A feedback network is also switched in circuit in a manner that maintains the buffer's loop gain substantially constant, whether or not the high current drive stage is in circuit.

6 Claims, 4 Drawing Figures

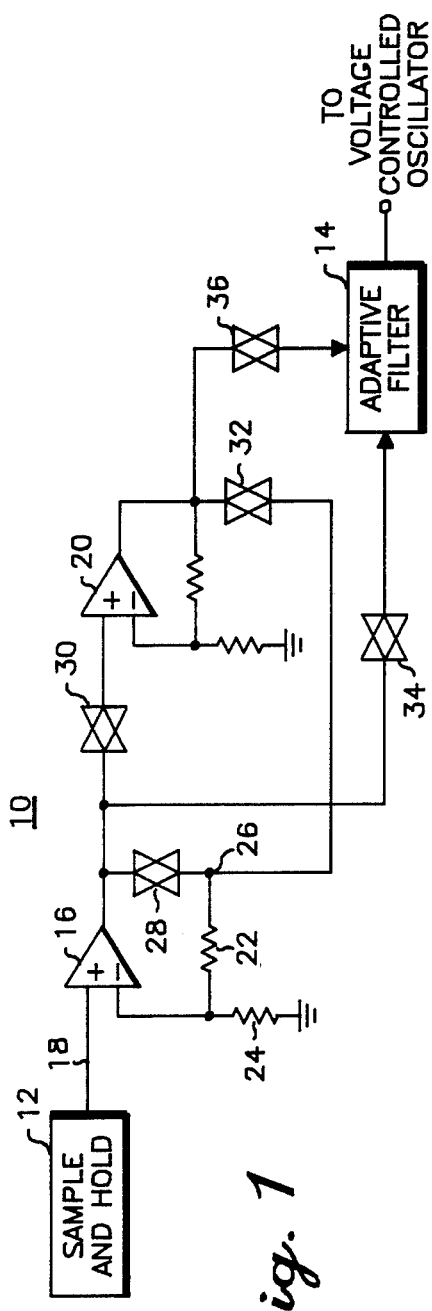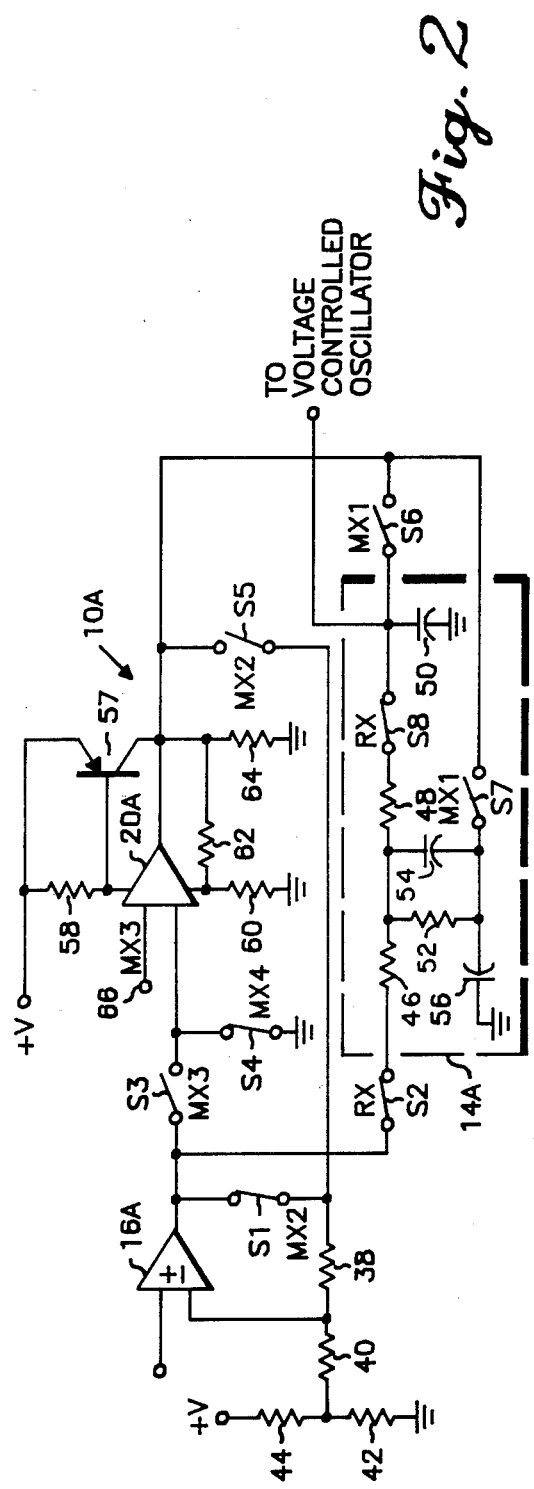

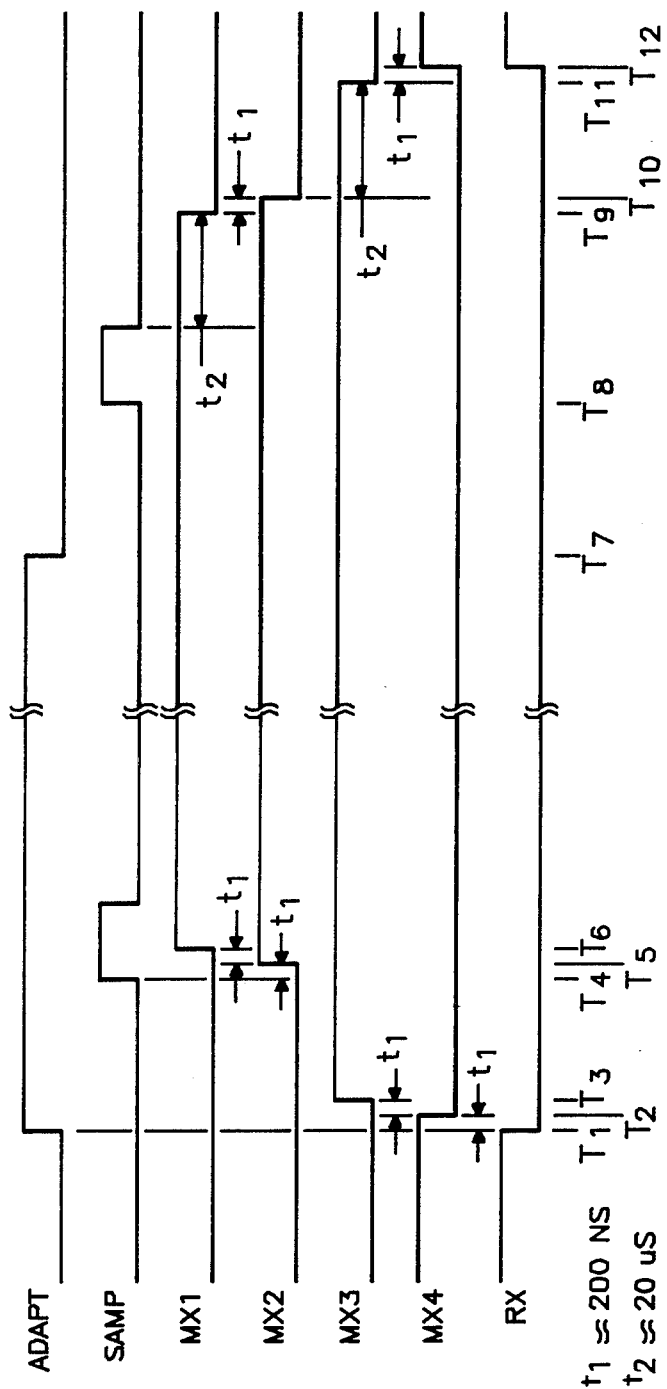

MULTIPLEXED BUFFER

FIELD OF THE INVENTION

This invention is generally directed to electronic buffer amplifiers (buffers), and particularly to buffers which exhibit low noise and relatively high current drive capabilities.

BACKGROUND OF THE INVENTION

Buffers are frequently used to provide isolation and/or gain between two electronic circuits. A single emitter-follower stage is an example of a very simple buffer.

More complex buffers are frequently required in situations where the buffer must have high current drive capabiities and yet exhibit low noise characteristics. Such high current/low noise buffers are available in bipolar form, but they are more difficult to build using CMOS or NMOS technology, primarily because of the difficulty in obtaining low noise and high current drive in MOS devices. Nevertheless, MOS-type buffers having high current drive and low noise capability are very desirable for certain applications.

Another desirable feature in the type of MOS buffer to which this invention is addressed is the ability to switch from a high current drive condition to a lower current drive/low noise condition as circumstances permit, thereby to reduce the current drain on the buffer's power supply. Of course, switching between these conditions must ordinarily be accomplished without a noticeable effect on the buffer's output signal. Conventional MOS-type buffers have simply not been able to provide this feature by using any commercially practical design.

OBJECTS OF THE INVENTION

It is a general object of the invention to provide an improved MOS buffer.

It is a more specific object of the invention to provide an MOS buffer which has both low noise and high current drive capabilities.

It is another object of the invention to provide such a buffer which can be switched from a high current drive capability to a lower current drive/low noise capability without noticeably affecting the buffer's output signal.

SUMMARY OF THE INVENTION

Broadly stated, the present buffer includes a first gain stage which has a low noise characteristic and which is provided with an input for receiving the signal which is to be buffered. The buffer also includes a second gain stage which has a relatively high current drive capability, a feedback network, and switching means for switching the buffer between a first, low noise operating mode and a second, high current drive mode.

In the first mode, the switching means preferably couples the output of the first stage directly to a load so that the load is driven in a low noise mode. In the second mode, the switching means couples the output of the first stage to the input of the second stage and couples the output of the second stage to the load. In this second mode, therefore, the load is driven by the combination of the low noise stage in series with the high current drive stage so as to provide the load with a high current drive. The switching means also operates to couple the feedback network in circuit with the first and second stages such that the buffer's loop gain remains substantially the same in both modes.

With this arrangement, the first and second stages may be constructed of MOS devices because no one stage is required to provide high current drive capability plus low noise characteristics.

BRIEF DESCRIPTION OF THE FIGURES

FIG. 1 illustrates one embodiment of a buffer according to the invention, and further illustrates a typical application for such a buffer;

FIG. 2 shows another embodiment of the buffer and the manner in which the buffer's output may be coupled to an adaptive filter;

FIG. 3 depicts various timing waveforms which are useful in explaining the operation of the buffer shown in FIG. 2; and FIG. 4 is a truth table which indicates when the switches shown in FIG. 2 are opened and closed.

DESCRIPTION OF THE PREFERRED EMBODIMENT

Referring now to FIG. 1, there is shown a buffer 10 constructed according to the invention so as to provide either a high current drive capability or a low noise capability, as required. In addition, the illustrated buffer 10, constructed of MOS devices, is capable of being rapidly switched between a high current drive mode and low noise mode without noticeably affecting its output signal.

One application for such a buffer is also shown in FIG. 1; namely, to act as a buffer between the output of a sample and hold circuit 12 and the input of an adaptive filter 14 which supplies a control signal to a VCO (voltage-controlled oscillator). In this type of application, the filter 14 will usually have one or more capacitors which must be charged and discharged by the buffer 10 so as to track the output of the sample and hold circuit 12. The buffer 10 provides such tracking by operating in a high current drive mode during intervals when it is necessary to change the frequency of the VCO, thereby providing faster charging or discharging of whatever capacitance is in the filter 14. When the VCO is in a locked condition (no frequency change is required), the buffer 10 is switched to a low noise mode to avoid any unwanted disturbances in the control voltage which is supplied to the VCO.

Referring more specifically to the buffer 10, it preferably includes a first gain stage 16 which exhibits low noise characteristics and which receives, via an input lead 18, the output of the sample and hold circuit 12. A second gain stage 20 is preferably a high current drive stage for rapidly charging and discharging the capacitance associated with the filter 14. Both these stages 16 and 20 may be conventional CMOS or NMOS operational amplifiers selected to have the previously mentioned low noise characteristics (for the stage 16) or the high current drive capability (for the stage 20).

A feedback network, shown as including resistors 22 and 24, has one terminal thereof coupled to the inverting input of the stage 16 and another terminal coupled to a node 26. As is discussed more fully below, this feedback network is used to control the loop gain of the buffer in both its modes of operation.

Also included in the buffer 10 is switching means for switching the buffer between its two modes of operation such that the filter 14 is driven by the first stage 16 during the low noise mode, and such that the filter is driven by the output of the second stage 20 during the high current drive mode. In the second mode, both stages of the buffer operate in series between the filter 14 and the sample and hold circuit 12. Also, the switching means is configured so as to hold the buffer's loop gain at a substantially constant level, irrespective of the mode the buffer is operating in.

The switching means which is illustrated includes electronic switches 28, 30, 32, 34 and 36. Each of these switches may be a conventional CMOS switch; i.e., a P-Channel device in parallel with an N-Channel device, provided that the switch impedance is small compared to the impedance which it drives.

To explain the operation of the buffer 10, it will first be assumed that the buffer is in its low noise mode of operation. In that case, switches 28 and 34 are closed while switches 30, 32 and 36 are open. Consequently, switch 28 couples the output of the first stage 16 to the feedback network composed of resistors 22 and 24, and the switch 34 couples the output of stage 16 to the load (filter 14). The open state of switches 30, 32 and 36 insure that the stage 20 has no effect on the load when the buffer is operating in the low noise mode.

Because the high current drive stage 20 serves no purpose while the low noise mode is in effect, it is preferred to turn off the stage 20 while in this mode in order to save power. Any suitable turn off technique may be employed and may be timed to coincide with the initiation of the low noise mode.

When the high current drive mode is to begin, the previously closed switches are opened and switches 30, 32 and 36 are closed. Consequently, the output of stage 16 is coupled to the input of stage 20 via the switch 30, the output of the stage 20 is coupled to the adaptive filter via the switch 36, and the output of the stage 20 is also coupled to the resistor 22. The latter connection causes both stages to be in a feedback loop in which the resistors 22 and 24 again control loop gain.

It is significant to note that the feedback network (resistors 22 and 24) which controls loop gain in the high current drive mode is the same feedback network which controlled loop gain in the low noise mode. This is desirable because it forces the buffer's overall loop gain to remain unchanged. The use of the common feedback network in addition to a common input stage for both modes of operation causes the magnitude of any offset voltage at the output of the buffer to remain constant. This effect is particularly important in the illustrated application because even very small changes at the output of the buffer can result in noticeable changes in the frequency of the VCO.

The result of the arrangement shown in FIG. 1 is that the illustrated buffer can be controlled to drive its load in a low noise mode or in a high current drive mode. Moreover, the individual amplifier stages may be made using conventional CMOS or NMOS technology because there is no requirement to combine low noise and high current drive capability in one stage. Further, variations in the buffer's output signal (such as changes in its offset voltage) which could otherwise result from changing modes is avoided by using a common input stage and a common feedback network for both modes of operation.

Depending on the application of the buffer 10, the timing of switch opening and switch closure may or may not be important. In some applications, it may be practical to simultaneously close all switches which are to be closed and to then simultaneously open all switches which are to be opened, or vice versa. However, when the buffer is to drive a very sensitive load such as an adaptive filter coupled to a VCO, it is preferable to carefully order the opening and closing of the various switches so as not to disturb the filter's output voltage. An example of such ordering will now be described in connection with the buffer 10A shown in FIG. 2.

The illustrated buffer 10A includes a low noise stage 16A, a high current drive Stage 20A, and plurality of switches S1 through S6. Additional switches S7 and S8 are shown as part of the adaptive filter 14A. The symbols used for these switches have been chosen because they illustrate whether a particular switch is open or closed.

For the condition shown in FIG. 2, the buffer is in its low noise mode wherein the filter 14A is being driven directly by the low noise stage 16A, and the VCO (not shown) is assumed to be in a locked condition. Specifically, the switch S1 is closed to couple the output of stage 16A to a feedback network comprising a resistor 38 and the effective resistance of resistors 40, 42 and 44. The resistors 42 and 44 also serve as a voltage divider to supply the proper DC operating voltage to the stage 16A. Also, the switch S2 is closed to couple the output of the stage 16A to the filter 14A, and the switch S4 is closed to ground the input to the stage 20A. All the other switches are open, except that switch S8 in the filter 14A is closed to couple the output of stage 16A through resistors 46 and 48 to the input of the VCO.

As the filter 14A is conventional, it will not be described in any further detail, except to note that it includes another resistor 52 in parallel with a capacitor 54, the combination being further coupled to a capacitor 56 which is grounded at its opposing terminal.

Before discussing the order in which the switches are activated, it should be noted that the stage 20A is coupled to a PNP transistor 57 as shown to allow the stage 20A to source more current. Also coupled to the stage 20A is a biasing resistor 58 and resistors 60, 62 and 64 which provide local feedback for the stage 20A.

The discussion which follows describes a preferred order of switch closure for the illustrated application. That ordered closure is described in terms of the waveforms shown in FIG. 3 which will now be briefly described.

The top waveform in FIG. 3, labelled "Adapt", may be generated by a microprocessor to indicate and/or to control the initiation of a change in the operating mode of the buffer. The next waveform, labeled "SAMP," goes high to indicate when a sample of an incoming signal is being taken by a sample and hold circuit (shown in FIG. 1 only) which may feed the signal input to the first stage 16A. The next five waveforms drive the illustrated switches to effect their closure and opening. The waveform labels which appear in FIG. 3 are also shown in FIG. 2 in association with the switch or switches controlled with each waveform. For example, the waveform labeled MX1 controls switches S6 and S7 while waveform MX2 controls switches S1 and S5.

Referring briefly to FIG. 4, a truth table is shown which relates the closing and opening of each switch to one of the times (T1 through T12) indicated in FIG. 3. For example, FIG. 4 indicates that the switch S1 opens (O) at time T5 and closes (C) at time T10. Switch S1 is also open at times T6 through T9 and is closed at times T11 through T4. The states of the other switches are indicated in a like manner.

Referring again to FIGS. 2 and 3, the illustrated operating mode of the buffer 10A is changed according to the following sequence. At time T1, the ADAPT signal goes high to signal the beginning of the sequence which will put the buffer 10A in its high current drive mode. At the same time, the signal RX goes low to open switches S2 and S8. This action disconnects the filter 14A from the buffer 10A.

Approximately 200 ns. later, the signal MX4 goes low at time T2. This event causes the switch S4 to open and begins the power-up sequence for the driver stage 20A. After another 200 ns. have elapsed (at T3), the signal MX3 goes high. Two events happen now. The switch S3 closes to couple the output of stage 16A to the input of stage 20A, and a power control line 66 goes high to turn on the driver stage 20A.

At time T4, the SAMP signal goes high, but this has no immediate effect on the state of any switch. About 200 ns. later (at time T5), the signal MX2 goes high. Consequently, the switch S1 opens and the switch S5 closes. This couples the feedback network in circuit with both stages to control the overall loop gain of the buffer.

The next occurence is at time T6 when the signal MX1 goes high. Switches S6 and S7 respond by closing to couple the filter 14A to the output of the driver stage 20A. The buffer and the filter are now conditioned to rapidly charge or discharge the capacitors 50 and 56 to change the operating frequency of the VCO.

At times T7 and T8, the ADAPT signal goes low and the SAMP signal goes high again without any immediate effect on the state of the switches. But the signal changes which follow will return the buffer to its low noise state on the assumption that the VCO has been locked to its new frequency.

At T9, the signal MX1 goes low. In response, the switches S6 and S7 open to isolate the charge on the filter capacitance. About 200 ns. later, at time T10, the signal MX2 goes low to close the switch S1 and to open the switch S5. This places the feedback network solely around the first stage 16A.

After a delay of about 20 microseconds to permit the output of the first stage to settle, the signal MX3 goes low at time T11. This powers down the second stage via the lead 66 and decouples the first and second stages by opening the switch S3.

At time T12, MX4 and RX go high. This causes closure of switches S2, S4 and S8. The buffer and filter are thus restored to the condition illustrated in FIG. 2 for operation in the low noise mode.

As should now be apparent to those skilled in the art, the buffer disclosed herein has the advantage of being able to operate at a relatively low average power consumption because the high drive stage may be turned off when high current drive is not needed. The ability to reduce power in that manner is made possible because the low noise mode of operation may be switched into operation without noticeably affecting the buffer's output voltage. The fact that the same feedback network controls the buffer's loop gain in both modes of operation, plus the fact that a common input stage is employed, is largely responsible for this desirable effect.

Although the invention has been described in terms of a preferred embodiment and in connection with an illustrative application, it will be obvious to those skilled in the art that various changes may be made without departing from the invention. Accordingly, it is intended that all such changes be considered as included within the spirit and scope of the invention as defined by the appended claims.

What is claimed is:

1. A buffer comprising:
    a first gain stage having a low noise characteristic and being adapted to receive an input signal to be buffered;
    a second gain stage having a relatively high current drive capability;
    a feedback network; and
    switch means operative in a first mode for coupling an output of the first stage to a load, and operative in a second mode for coupling the output of the first stage to an input of the second stage and for coupling an output of the second stage to said load, said switch means also being operative to couple the feedback network with the first and second stages such that the buffer's loop gain remains substantially the same in both modes.

2. A buffer as set forth in claim 1, which further includes means for disabling said second stage when the buffer operates in said first mode.

3. A buffer as set forth in claim 1 wherein said switch means couples the feedback network around the first stage in the first mode and wherein the switch means couples the feedback network around the series combination of the first and second stages in the second mode.

4. A buffer as set forth in claim 3 wherein the feedback network includes one terminal which is coupled to an input of the first stage and a second terminal, and wherein said switch means includes a first switch coupled between the output of the first stage and the second terminal of the feedback network, a second switch for coupling the output of the first stage to said load, and a third switch coupled between the output of the first stage and the input of the second stage, and wherein the first and second switches are closed and the third switch is open in the first mode of operation.

5. A buffer as set forth in claim 4 wherein said switch means further includes a fourth switch coupled between ground and the input to the second stage, a fifth switch coupled between the output of the second stage and the second terminal of the feedback network, and a sixth switch for coupling the output of the second stage to said load, and wherein the fourth switch is open in the second mode of operation and the fifth and sixth switches are closed in the second mode of operation.

6. An MOS buffer having first and second modes of operation, comprising:
    a first MOS gain stage having a low noise characteristic and being adapted to receive an input signal to be buffered;
    a second MOS gain stage having a relatively high current drive characteristic;
    a feedback network having one terminal coupled to an input of the first stage and having a second terminal;
    a first switch coupled between an output of the first stage and the second terminal of the feedback network, said first switch being closed in the first mode and open in the second mode;
    a second switch for coupling the output of the first stage to a load, the second switch being closed in the first mode and open in the second mode;
    a third switch coupled between the output of the first stage and an input to the second stage, the third switch being open in the first mode and closed in the second mode;

a fourth switch coupled between ground and the input to the second stage, the fourth switch being closed in the first mode and open in the second mode;

a fifth switch coupled between an output of the second stage and the second terminal of the feedback network, the fifth switch being open in the first mode and closed in the second mode; and a sixth switch for coupling the output of the second stage to said load, the sixth switch being open in the first mode and closed in the second mode, whereby the buffer operates as a low noise buffer in the first mode and as a high current drive buffer in the second mode, and the buffer's loop gain is maintained relatively constant in the first and second modes.

* * * * *